(12) United States Patent
Ha et al.

(10) Patent No.: US 12,429,967 B2
(45) Date of Patent: Sep. 30, 2025

(54) DISPLAY DEVICE

(71) Applicant: LG Display Co., Ltd., Seoul (KR)

(72) Inventors: Jongmoo Ha, Gimpo-si (KR); Kyuwon Kyoung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/366,582

(22) Filed: Aug. 7, 2023

(65) Prior Publication Data

US 2024/0053846 A1 Feb. 15, 2024

(30) Foreign Application Priority Data

Aug. 11, 2022 (KR) .......................... 10-2022-0100909

(51) Int. Cl.
*G06F 3/041* (2006.01)
*H10K 59/122* (2023.01)
*H10K 59/40* (2023.01)
*H10K 59/80* (2023.01)

(52) U.S. Cl.
CPC ......... *G06F 3/0412* (2013.01); *H10K 59/122* (2023.02); *H10K 59/40* (2023.02); *H10K 59/873* (2023.02); *H10K 59/879* (2023.02); *G06F 3/04164* (2019.05); *G06F 2203/04111* (2013.01)

(58) Field of Classification Search
CPC .. G06F 2203/04111; G06F 2203/04112; G06F 3/0412; G06F 3/04164; G06F 3/0443; G06F 3/0446; H10K 50/844; H10K 59/122; H10K 59/40; H10K 59/873; H10K 59/879
See application file for complete search history.

(56) References Cited

U.S. PATENT DOCUMENTS

| 11,706,967 | B2* | 7/2023 | Lim ..................... H10K 71/00 345/173 |
| 2018/0151838 | A1* | 5/2018 | Park ................... H10K 50/8445 |
| 2019/0179466 | A1* | 6/2019 | Kim ..................... G06F 3/04164 |
| 2019/0221779 | A1* | 7/2019 | Jang ..................... H10K 59/122 |
| 2021/0200382 | A1* | 7/2021 | Lee ....................... G06F 3/0446 |
| 2022/0199700 | A1* | 6/2022 | Shin ..................... H10K 50/856 |
| 2022/0206613 | A1* | 6/2022 | Choi ..................... H10K 59/40 |

FOREIGN PATENT DOCUMENTS

KR 102262683 B1 6/2021

* cited by examiner

*Primary Examiner* — Kenneth Bukowski
(74) *Attorney, Agent, or Firm* — Seed Intellectual Property Law Group LLP

(57) ABSTRACT

The present disclosure relates to a display device. A display device according to an exemplary embodiment of the present disclosure includes a substrate including an active area and a non-active area. The device includes a plurality of light emitting elements disposed in the active area of the substrate. The device includes an encapsulation unit disposed to cover the plurality of light emitting elements. The device includes a touch sensing unit disposed on the encapsulation unit and including a plurality of touch electrodes. The device includes an organic structure disposed on the plurality of touch electrodes to cover upper and side surfaces of the plurality of touch electrodes. Therefore, it is possible to suppress the occurrence of a phenomenon by which the plurality of touch electrodes can be seen by a user.

12 Claims, 10 Drawing Sheets

DISPLAY DEVICE

CROSS-REFERENCE TO RELATED APPLICATIONS

This application claims the priority of Korean Patent Application No. 10-2022-0100909 filed on Aug. 11, 2022, in the Korean Intellectual Property Office, the disclosure of which is incorporated herein by reference.

BACKGROUND

Technical Field

The present disclosure relates to a display device, and more particularly, to a display device in which touch lines can be made less visible.

Description of the Related Art

Along with the development of the information society, demands for display devices that display images are growing. In this regard, various types of display devices, such as liquid crystal display devices and organic light emitting diode display devices, have been widely used.

To provide more diverse functions to users, these display devices provide a function of recognizing a user's touch on a display panel and processing an input based on the recognized touch.

A display device capable of touch recognition includes a plurality of touch electrodes disposed or built in a display panel, and may detect the presence or absence of a user's touch and, if any, touched coordinates on the display panel by driving the touch electrodes.

BRIEF SUMMARY

Various embodiments of the present disclosure provide a display device in which touch lines may be made less visible.

Various embodiments of the present disclosure provide a display device which may suppress the invasion of an organic layer with high flowability into a pad area of the display device.

Various embodiments of the present disclosure provide a display device which may improve a viewing angle.

Various embodiments of the present disclosure provide a display device which may improve transmittance and color gamut.

The technical benefits of the present disclosure are not limited to the above-mentioned benefits, and other benefits, which are not mentioned above, can be clearly understood by those skilled in the art from the following descriptions.

According to an aspect of the present disclosure, a display device includes a substrate configured to include an active area and a non-active area. Also, the display device includes a plurality of light emitting elements disposed in the active area of the substrate. Further, the display device includes an encapsulation unit disposed to cover the plurality of light emitting elements. Furthermore, the display device includes a touch sensing unit disposed on the encapsulation unit and including a plurality of touch electrodes. Moreover, the display device includes an organic structure disposed on the plurality of touch electrodes to cover upper and side surfaces of the plurality of touch electrodes.

According to another aspect of the present disclosure, a display device includes a substrate configured to include an active area with a plurality of pixels and a non-active area surrounding the active area. Also, the display device includes a plurality of light emitting elements disposed to correspond to the plurality of pixels. Further, the display device includes an encapsulation unit disposed on the plurality of light emitting elements. Furthermore, the display device includes a touch sensing unit disposed on the encapsulation unit and including a plurality of touch electrodes. Moreover, the display device includes an organic structure disposed to cover the plurality of touch electrodes. Also, the display device includes an organic layer disposed to cover the touch sensing unit and the organic structure.

Other detailed matters of the exemplary embodiments are included in the detailed description and the drawings.

According to the present disclosure, an organic structure is disposed on a touch electrode made of a metal. Thus, it is possible to suppress the occurrence of a phenomenon by which the touch electrode can be seen by a user due to the refractive index of the organic structure.

In a display device according to the present disclosure, the organic structure is disposed on the touch electrode and an organic layer with high flowability is disposed on the organic structure. Thus, it is possible to suppress the invasion of the organic layer with high flowability into a pad area.

According to the present disclosure, a lens layer is formed to correspond to an emission area. Thus, it is possible to improve a viewing angle and enhance luminance efficiency.

According to the present disclosure, a part of a layer disposed in an area corresponding to the emission area is removed. Thus, it is possible to improve transmittance and color gamut of the display device.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
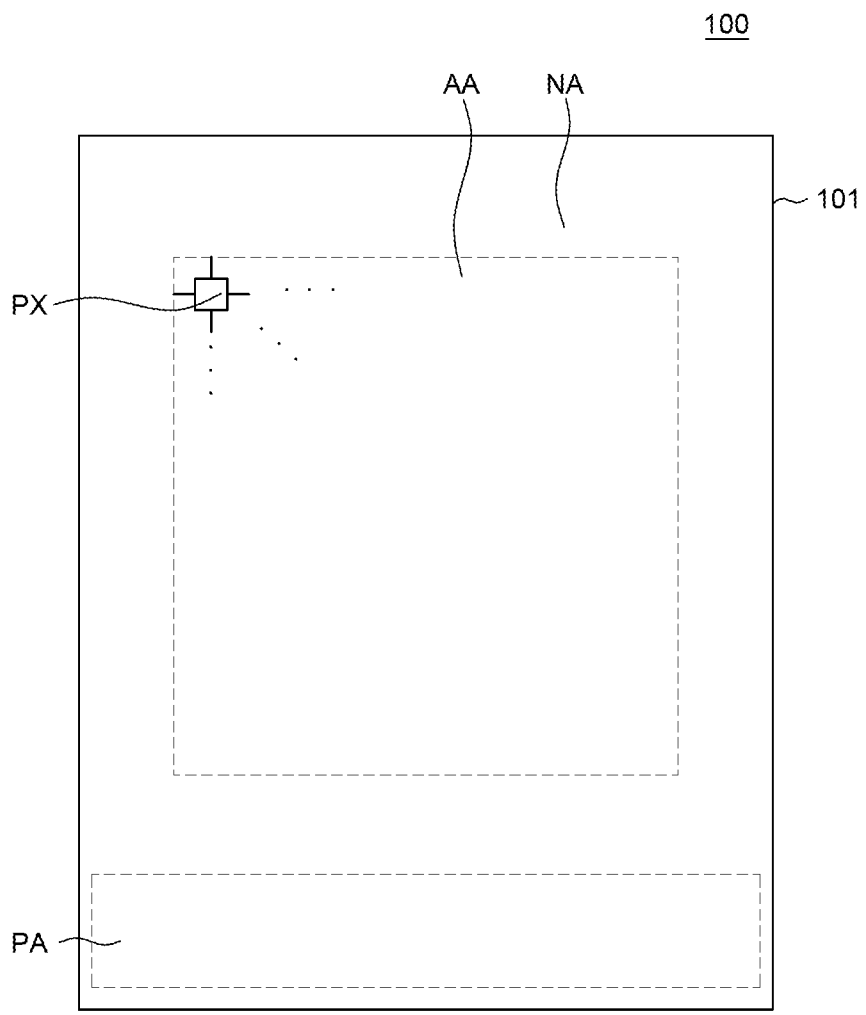
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a schematic plan view of a display device according to an exemplary embodiment of the present disclosure.

For the convenience of description, FIG. 1 illustrates only a substrate 101 and a sub-pixel PX among a variety of components of a display device 100.

The substrate 101 supports a variety of components included in the display device 100 and may be made of an insulating material. For example, the substrate 101 may be made of a transparent insulating material, such as glass, a resin or the like. Further, the substrate 101 may be made of a material including a polymer or plastic, or may be made of a plastic material having flexibility.

A plurality of gate lines and a plurality of data lines are disposed to overlap each other and on the substrate 101. A plurality of pixels PX is defined at intersections between the plurality of gate lines and the plurality of data lines, respectively. An area in which the plurality of pixels PX for implementing images is disposed can be referred to as an active area AA. An area disposed at an outer periphery of the active area AA and having no pixel PX can be referred to as a non-active area NA.

A display unit for displaying an image and a circuit unit for driving the display unit may be formed in the active area AA. For example, when the display device 100 is an organic light emitting display device, the display unit may include a light emitting element. That is, the display unit may include an anode, an organic emission layer on the anode, and a cathode on the organic emission layer. The organic emission layer may include, for example, a hole transport layer, a hole injection layer, an emission layer, an electron injection layer, and an electron transport layer. However, when the display device 100 is a liquid crystal display device, the display unit may be configured to include a liquid crystal layer. Hereinafter, it is assumed that the display device 100 is an organic light emitting display device for the convenience of description, but the present disclosure is not limited thereto.

The circuit unit may include various transistors, capacitors, and lines for driving the light emitting element. For example, the circuit unit may include various components, such as a driving transistor, a switching transistor, a storage capacitor, a gate line and a data line, but is not limited thereto.

The non-active area NA is an area where an image is not displayed and various lines, circuits, and the like are disposed for driving the display unit disposed in the active area AA.

The non-active area NA may be defined as an area surrounding the active area AA as shown in FIG. 1. However, the present disclosure is not limited thereto, and the non-active area NA may be defined as an area extending from the active area AA. Further, the non-active area NA may be defined as an area extending from a plurality of sides of the active area AA.

In the non-active area NA, COF, FPCB, and the like in which various ICs and driving circuits, such as a gate driver IC and a data driver IC are disposed, may be disposed. Also, a driving circuit referred to as a gate in panel (GIP) may be disposed in the non-active area NA.

The non-active area NA may further include a pad area PA in which touch pads PAD are formed.

Hereinafter, the display device 100 will be described in more detail with reference to FIG. 2 and FIG. 3.

Figure 2:
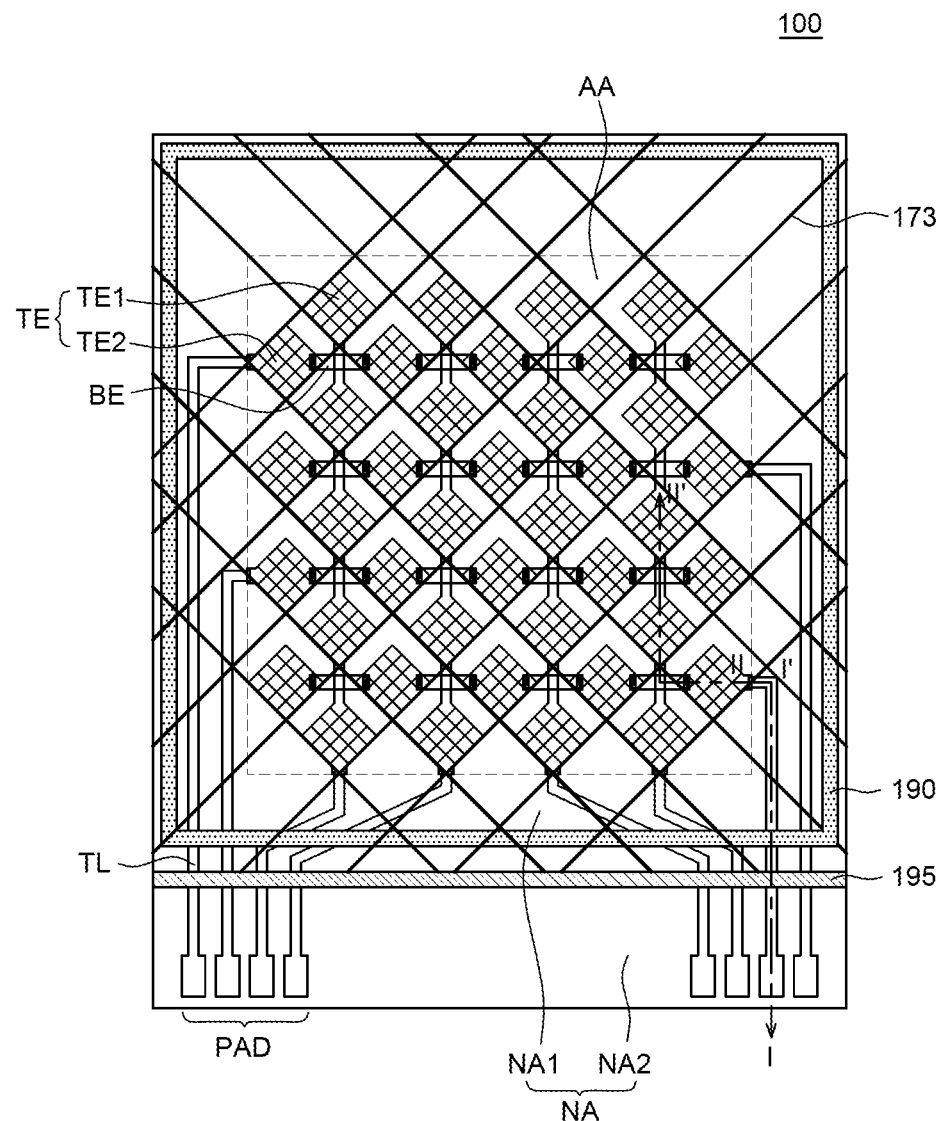
FIG. 2 is a plan view illustrating an aspect of the display device illustrated in FIG. 1.

FIG. 2 is a plan view of the display device according to an exemplary embodiment of the present disclosure. FIG. 3 is a cross-sectional view of the display device as taken along lines I-I' and II-IP of FIG. 2.

A transistor 110 for driving each pixel is disposed in the active area AA of the substrate 101. The transistor 110 includes an active layer 111, a gate electrode 112, a source electrode 113, and a drain electrode 114.

The active layer 111 is disposed on the substrate 101. The active layer 111 may be made of polysilicon (p-Si), amorphous silicon (a-Si), or an oxide semiconductor, but is not limited thereto.

A gate insulating layer 115 is disposed on the substrate 101 and the active layer 111. The gate insulating layer 115 may be made of silicon oxide (SiOx), silicon nitride (SiNx), or a multilayer thereof.

The gate electrode 112 is disposed on the gate insulating layer 115. The gate electrode 112 is disposed on the gate insulating layer 115 so as to overlap the active layer 111. The gate electrode 112 may be made of various conductive materials, such as magnesium (Mg), aluminum (Al), nickel (Ni), chromium (Cr), molybdenum (Mo), tungsten (W), gold (Au), or an alloy thereof, but is not limited thereto.

An interlayer insulating layer 120 is disposed on the gate insulating layer 115 and the gate electrode 112. The interlayer insulating layer 120 may be made of silicon oxide (SiOx), silicon nitride (SiNx), or a multilayer thereof.

The source electrode 113 and the drain electrode 114 are disposed on the interlayer insulating layer 120. The source electrode 113 and the drain electrode 114 are electrically connected to the active layer 111 through contact holes formed in the gate insulating layer 115 and the interlayer insulating layer 120. The source electrode 113 and the drain electrode 114 may be made of various conductive materials, such as magnesium (Mg), aluminum (Al), nickel (Ni), chromium (Cr), molybdenum (Mo), tungsten (W), gold (Au), or an alloy thereof, but is not limited thereto.

A protective layer 125 for insulating the thin film transistor 110 may be disposed on the source electrode 113 and the drain electrode 114. The protective layer 125 may be an inorganic film made of, for example, a silicon oxide (SiOx), silicon nitride (SiNx), or a multilayer thereof.

A planarization layer 130 is disposed on the protective layer 125. The planarization layer 130 protects the transistor 110 and planarizes an upper portion of the transistor 110. For example, the planarization layer 130 may be an organic insulating layer made of, for example, benzocyclobutene (BCB) or acryl, but is not limited thereto.

A light emitting element 140 is disposed on the planarization layer 130. The light emitting element 140 includes an anode 141, an organic emission layer 142, and a cathode 143.

The anode 141 is formed on the planarization layer 130 so as to correspond to an emission area of each pixel PX. The anode 141 may be electrically connected to the drain electrode 114 of the transistor 110 through a contact hole of the planarization layer 130. The anode 141 may be made of a metallic material.

When the display device 100 is a top emission type, the anode 141 may further include a transparent conductive layer and a reflective layer on the transparent conductive layer. In the top emission type, light emitted from the light emitting element 140 is discharged toward an upper side of the substrate 101 on which the light emitting element 140 is disposed. The transparent conductive layer may be made of transparent conductive oxide, such as ITO or IZO. The reflective layer may be made of silver (Ag), aluminum (Al), gold (Au), molybdenum (Mo), tungsten (W), chromium (Cr), or an alloy thereof.

A bank layer 150 is formed in a remaining area excluding an emission area. Therefore, the bank layer 150 may expose the anode 141 corresponding to the emission area. The bank layer 150 may be made of an inorganic insulating material, such as silicon nitride (SiNx) or silicon oxide (SiOx), or an organic insulating material, such as BCB resin, acrylic resin or imide resin, but is not limited thereto.

Although not illustrated, a spacer may be further formed on the bank layer 150. The spacer may be made of the same material as the bank layer 150. The spacer may function to suppress damage to the light emitting element 140 which may be caused by a fine metal mask (FMM) used to pattern the organic emission layer 142.

The organic emission layer 142 is disposed on the anode 141 exposed by the bank layer 150. The organic emission layer 142 includes a hole injection layer, a hole transport layer, an emission layer, an electron transport layer, an electron injection layer, and the like. The organic emission layer 142 may have a single emission layer structure which emits single light or may have a structure composed of a plurality of emission layers to emit white light.

The cathode 143 is disposed on the organic emission layer 142. The cathode 143 supplies electrons into the organic emission layer 142 and thus may be made of a conductive layer having a low work function. The cathode 143 may be a single layer formed over the plurality of sub-pixels PX. That is, the respective cathodes 143 of the plurality of sub-pixels PX may be connected to each other to form one body.

An encapsulation unit 160 is disposed on the cathode 143. The encapsulation unit 160 may protect the light emitting element 140 from moisture and oxygen. When the light emitting element 140 is exposed to moisture or oxygen, a pixel shrinkage phenomenon in which the light emitting element 140 is shrunk may occur or dark spots may be generated in the emission area.

For example, the encapsulation unit 160 may include a first inorganic encapsulation layer 161, an organic encapsulation layer 162 on the first inorganic encapsulation layer 161, and a second inorganic encapsulation layer 163 on the organic encapsulation layer 162. The first inorganic encapsulation layer 161 and the second inorganic encapsulation layer 163 may be inorganic insulating layers. For example, the first inorganic encapsulation layer 161 and the second inorganic encapsulation layer 163 may be made of an inorganic insulating material, such as silicon nitride (SiNx), silicon oxide (SiOx), silicon oxynitride (SiON), or aluminum oxide ($Al_2O_3$). The organic encapsulation layer 162 may be made of an organic insulating layer. For example, the organic encapsulation layer 162 may be made of acrylic resin or epoxy resin. The second inorganic encapsulation layer 163 may cover upper surfaces and side surfaces of the first inorganic encapsulation layer 161 and the organic encapsulation layer 162. The second inorganic encapsulation layer 163 may minimize or block the permeation of external moisture or oxygen into the first inorganic encapsulation layer 161 and the organic encapsulation layer 162. The first inorganic encapsulation layer 161 and the second inorganic encapsulation layer 163 serve to block the permeation of moisture or oxygen. Also, the organic encapsulation layer 162 serves to planarize an upper portion of the first inorganic encapsulation layer 161. However, a configuration of the encapsulation unit 160 is not limited thereto.

A dam 190 which blocks the flow of the organic encapsulation layer 162 of the encapsulation unit 160 may be disposed in the non-active area NA. Specifically, the dam 190 in the non-active area NA may be formed into a closed curve surrounding the active area AA. Also, the first inorganic encapsulation layer 161 and the second inorganic encapsulation layer 163 may be disposed on the dam 190, and the dam 190 may block the flow of the organic encapsulation layer 162. The dam 190 needs to be formed with a predetermined height or higher to block the flow of the organic encapsulation layer 162. To this end, the dam 190 may be formed of at least one layer made of an organic material. For example, the dam 190 may include a lower layer made of the same material as the planarization layer 130 and an upper layer made of the same material as the bank layer 150, but is not limited thereto. Two dams 190 are illustrated in the drawing, but one dam 190 or three or more dams 190 may be provided.

A touch sensing unit (also referred to as a touch sensing circuit) is formed on the encapsulation unit 160. Specifically, the touch sensing unit may include a touch buffer layer 171 disposed on the encapsulation unit 160, and a bridge electrode BE disposed on the touch buffer layer 171. Also, the touch sensing unit may include a touch interlayer insulating layer 172 disposed on the touch buffer layer 171 and the bridge electrode BE, and a plurality of touch electrodes TE1 and TE2. The plurality of touch electrodes TE1 and TE2 includes a first touch electrode TE1 and a second touch electrode TE2 disposed on the touch interlayer insulating layer 172 and overlapping each other.

The touch buffer layer 171 may be formed such that the touch pad PAD is exposed in a display panel DP and the non-active area NA. The touch buffer layer 171 may be formed to cover the dam 190 disposed in the non-active area NA.

The touch buffer layer 171 may block the permeation of external moisture, foreign materials, or chemical solutions, such as a development solution or an etching solution used in manufacturing the touch electrodes formed on the touch buffer layer 171.

The bridge electrode BE is disposed on the touch buffer layer 171. The bridge electrode BE is disposed in the active area AA and electrically connects the second touch electrodes TE2 on the touch interlayer insulating layer 172.

To suppress a mutual short circuit at an overlap between the first touch electrode TE1 and the second touch electrode TE2, second touch electrodes TE2 adjacent to each other may be electrically connected by the bridge electrode BE. The bridge electrode BE may be disposed in a layer different from the first touch electrode TE1 and the second touch electrode TE2 and may be connected to the adjacent second touch electrode TE2 through a contact hole. The bridge electrode BE may overlap the first touch electrode TEL In this case, the contact hole may pass through the touch interlayer insulating layer 172. The bridge electrode BE may be disposed under the touch interlayer insulating layer 172 and exposed by two contact holes. Therefore, the bridge electrode BE may be connected to two second touch electrodes TE2 adjacent thereto.

The touch interlayer insulating layer 172 may be disposed on the touch buffer layer 171 to cover the bridge electrode BE and may insulate the bridge electrode BE from the first touch electrode TEL Also, the touch interlayer insulating layer 172 may be disposed between the bridge electrodes BE to insulate the bridge electrodes BE from each other.

The touch interlayer insulating layer 172 may be formed in the non-active area NA as well as the active area AA. The touch interlayer insulating layer 172 may be formed to cover the dam 190 and thus can reduce a step difference caused by the dam 190.

A plurality of touch electrodes TE1 and TE2 is formed on the touch interlayer insulating layer 172. The first touch electrodes TE1 may be touch driving electrodes, and the second touch electrodes TE2 may be touch sensing electrodes. The first touch electrodes TE1 may be connected in a first direction to form a plurality of electrode columns. Also, the second touch electrodes TE2 may be connected by the bridge electrodes BE in a row direction to form a plurality of electrode rows.

Herein, the first touch electrodes TE1, the second touch electrodes TE2, and the bridge electrodes BE are disposed in an area corresponding to the active area AA of the display panel DP.

The first touch electrodes TE1 and the second touch electrodes TE2 may form a specific shape. For example, as illustrated in FIG. 2, the first touch electrodes TE1 and the second touch electrodes TE2 may have a mesh pattern including a plurality of rhombus shapes. The first touch electrodes TE1 and the second touch electrodes TE2 may be made of metals including at least one of titanium (Ti), aluminum (Al), molybdenum (Mo), molybdenum-titanium (MoTi), copper (Cu), and tantalum (Ta). Alternatively, the first touch electrodes TE1 and the second touch electrodes TE2 may be made of transparent conductive materials, such as indium-tin-oxide (ITO) and indium-zinc-oxide (IZO), but are not limited thereto. Light emitted from the display device 100 may pass through the first touch electrodes TE1 and the second touch electrodes TE2 made of transparent conductive materials and then may be emitted to the outside. However, the present disclosure is not limited thereto. Light emitted from the display device 100 may be emitted to the outside through a plurality of openings included in the first touch electrodes TE1 and the second touch electrodes TE2.

The plurality of touch electrodes TE1 and TE2 may be disposed in an area corresponding to the bank layer 150. Therefore, it is possible to minimize a decrease in light emission efficiency caused by an overlap between the plurality of touch electrodes and the emission area.

Meanwhile, a plurality of touch pads PAD is disposed in the non-active area NA. Also, a plurality of touch routing lines TL electrically connecting the plurality of touch pads PAD and the plurality of touch electrodes TE1 and TE2 may be disposed on the touch interlayer insulating layer 172.

Each of the plurality of touch routing lines TL electrically connects each of the plurality of touch electrodes TE disposed in the active area AA and the touch pad PAD disposed in the non-active area NA. For example, a touch driving signal may be applied to the first touch electrode TE1 through the touch routing line TL connected to the first touch electrode TEL Also, a touch sensing signal may be transferred to the second touch electrode TE2 through the touch routing line TL connected to the second touch electrode TE2.

The touch routing line TL may be made of a low-resistance metal or a transparent conductive material, such as ITO and IZO, but is not limited thereto. For example, when the plurality of touch routing lines TL is made of a low-resistance metal, a resistance may be decreased, which may cause a decrease in RC delay.

One ends of the plurality of touch pads PAD may be connected to the touch routing line TL and the other ends thereof may be electrically connected to an external circuit such as a touch driver. Thus, the plurality of touch pads PAD may serve to receive a touch signal from the external circuit or transfer a touch sensing signal to the external circuit.

The plurality of touch pads PAD may be disposed on the same layer and made of the same material as the gate electrode 112.

An organic structure 173 is disposed on the plurality of touch electrodes TE1 and TE2 to cover upper and side surfaces of the plurality of touch electrodes TE1 and TE2.

Conventionally, an organic insulating film has been used as an uppermost layer of a display device including a touch sensing unit. However, when the uppermost layer of the display device is an organic insulating film, the organic insulating film cannot compensate for a step difference caused by a plurality of touch electrodes disposed under the organic insulating film. Thus, a step difference occurs in the uppermost layer of the display device. To compensate for the step difference, research has been made to add an organic layer with high flowability to the uppermost layer of the display device including the touch sensing unit. However, in this case, the organic layer with high flowability may invade a pad area and thus may cause a defect.

In a display device including a touch sensing unit according to an exemplary embodiment of the present disclosure, an organic insulating film serving as an uppermost layer of the display device is configured as the organic structure 173. The organic structure 173 covers the upper and side surfaces of the plurality of touch electrodes TE1 and TE2, and an organic layer 180 is disposed on the organic structure 173.

The organic structure 173 is disposed to cover the upper and side surfaces of the plurality of touch electrodes TE1 and TE2. Thus, if the plurality of touch electrodes TE1 and TE2 is made of metals, it is possible to suppress the occurrence of a phenomenon by which the plurality of touch electrodes TE1 and TE2 can be seen by a user due to the refractive index of the organic structure 173.

Also, since the organic layer 180 is disposed on the organic structure 173, it is possible to suppress the occurrence of a step difference in the uppermost layer of the display device. Therefore, it is possible to improve the visibility of the display device.

The organic structure 173 covers the upper and side surfaces of the plurality of touch electrodes TE1 and TE2. Thus, even if the organic layer 180 with high flowability is disposed on the organic structure 173, the organic structure 173 may block the flow of the organic layer 180 or induce the organic layer 180 to flow along the shape of the organic structure 173. Therefore, it is possible to block the flow of the organic layer 180 to the touch pad PAD.

Herein, the organic structure 173 may have a greater height than the touch sensing unit. In this case, it is possible to further block the flow of the organic layer 180 to the touch pad PAD by blocking the flow of the organic layer 180 with the organic structure 173 or inducing the organic layer 180 to flow along the shape of the organic structure 173.

Meanwhile, a wall 195 may be further provided between the dam 190 disposed in the non-active area NA and the plurality of touch pads PAD. The wall 195 may be disposed on the plurality of touch routing lines TL. For example, the wall 195 may be disposed on the same layer and made of the same material as the organic structure 173. The wall 195 may have a greater height than the dam 190 and the same height as the organic structure 173 to block the flow of the organic layer 180 to the touch pad PAD.

The non-active area NA includes an area corresponding to the inside of the wall 195, i.e., a first non-active area NA1 adjacent to the active area AA with respect to the wall 195. Also, the non-active area NA includes an area corresponding to the outside of the wall 195, i.e., a second non-active area NA2 far from the active area AA with respect to the wall 195. Herein, the organic structure 173 is disposed along a shape of each of the plurality of touch electrodes TE1 and TE2 in the active area AA and the first non-active area NA1. Therefore, the organic structure 173 is disposed in the entire area excepting the second non-active area NA2. Thus, the overall flatness of the organic layer 180 disposed on the organic structure 173 may be improved. Also, the organic structure 173 is disposed to cover the upper and side surfaces of the plurality of touch electrodes TE1 and TE2 disposed in the entire active area AA. Thus, it is possible to suppress the occurrence of a phenomenon by which the plurality of touch electrodes made of metals can be seen by a user.

Hereinafter, a display device according to another exemplary embodiment of the present disclosure will be described with reference to FIG. 4.

Figure 4:
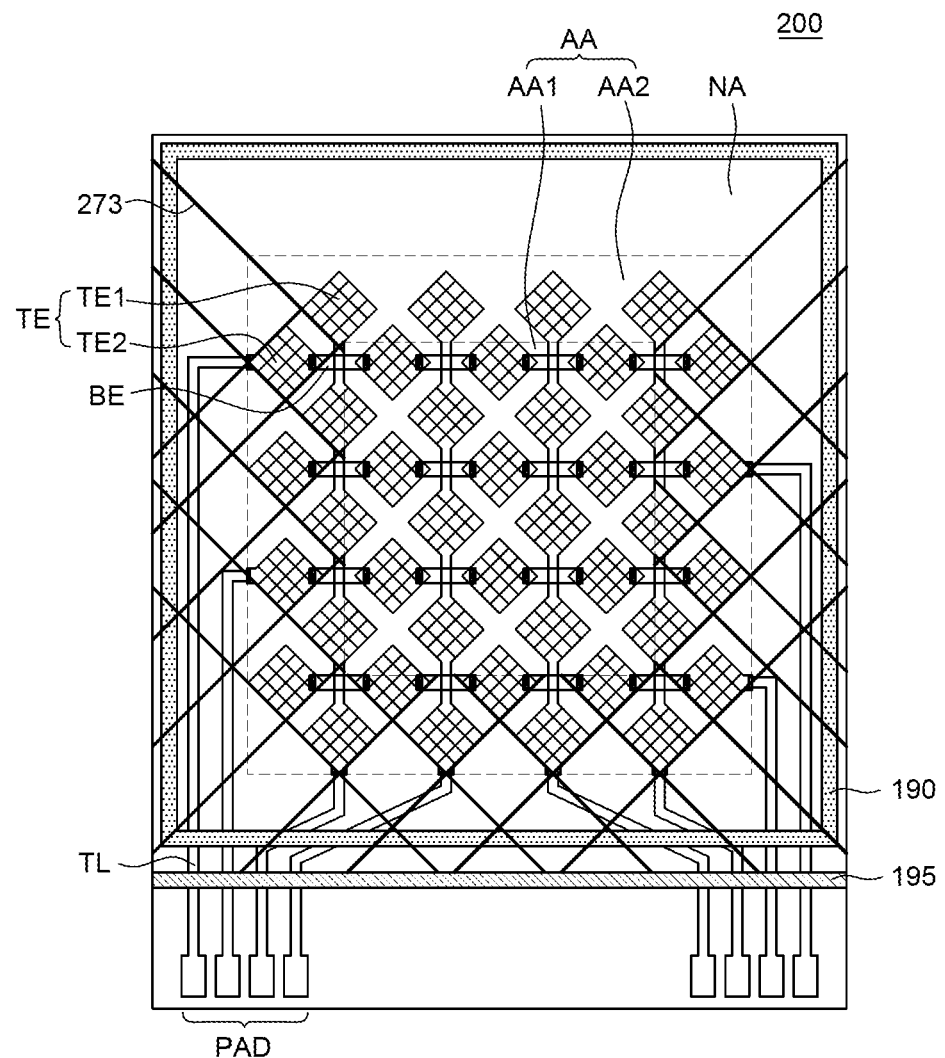
FIG. 4 is a plan view illustrating another aspect of the display device illustrated in FIG. 1.

FIG. 4 is a plan view illustrating another aspect of the display device illustrated in FIG. 1.

Figure 3:
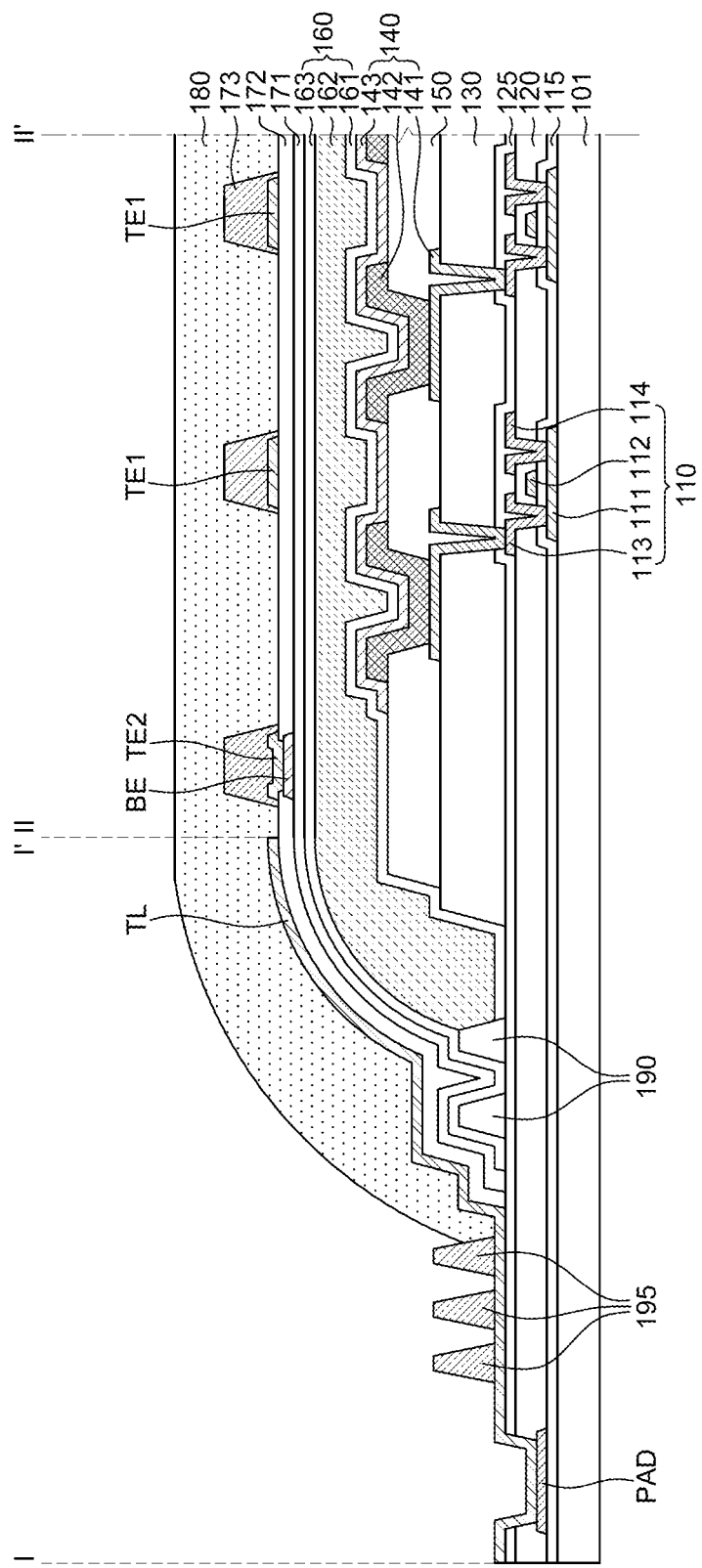
FIG. 3 is a cross-sectional view of the display device taken along lines I-I' and II-II' of FIG. 2.

The display device illustrated in FIG. 4 is substantially the same as the display device illustrated in FIG. 1 through FIG. 3 except the placement of an organic structure 273. Therefore, a redundant description thereof will be omitted.

Referring to FIG. 4, the active area AA includes a first active area AA1 corresponding to a central portion of the active area AA and a second active area AA2 surrounding the first active area AA1.

Herein, the organic structure 273 has a layer shape throughout the first active area AA1 and disposed along the shape of each of the plurality of touch electrodes TE1 and TE2 in the second active area AA2. The organic structure 273 disposed along the shape of each of the plurality of touch electrodes TE1 and TE2 in the second active area AA2 and the non-active area NA.

For example, if the organic structure 273 is excessively disposed on the touch sensing unit along the plurality of touch electrodes TE1 and TE2, an organic layer 180 disposed thereon may have restricted flowability. Thus, the organic layer 180 may not cover the entire active area AA.

Therefore, the organic structure 273 has a layer shape in the first active area AA1 corresponding to the central portion of the active area AA. Also, the organic structure 273 is disposed along the shape of each of the plurality of touch electrodes TE1 and TE2 in the outside of the first active area AA1, i.e., in the second active area AA2 and the non-active area NA. Accordingly, the organic layer 180 may be uniformly coated in the entire active area AA and the flow of the organic layer 180 is restricted in the non-active area NA. Thus, it is possible to easily suppress the overflow of the organic layer 180 to the touch pad PAD.

Hereinafter, a display device according to yet another exemplary embodiment of the present disclosure will be described with reference to FIG. 5A through FIG. 5C.

Figure 5A:
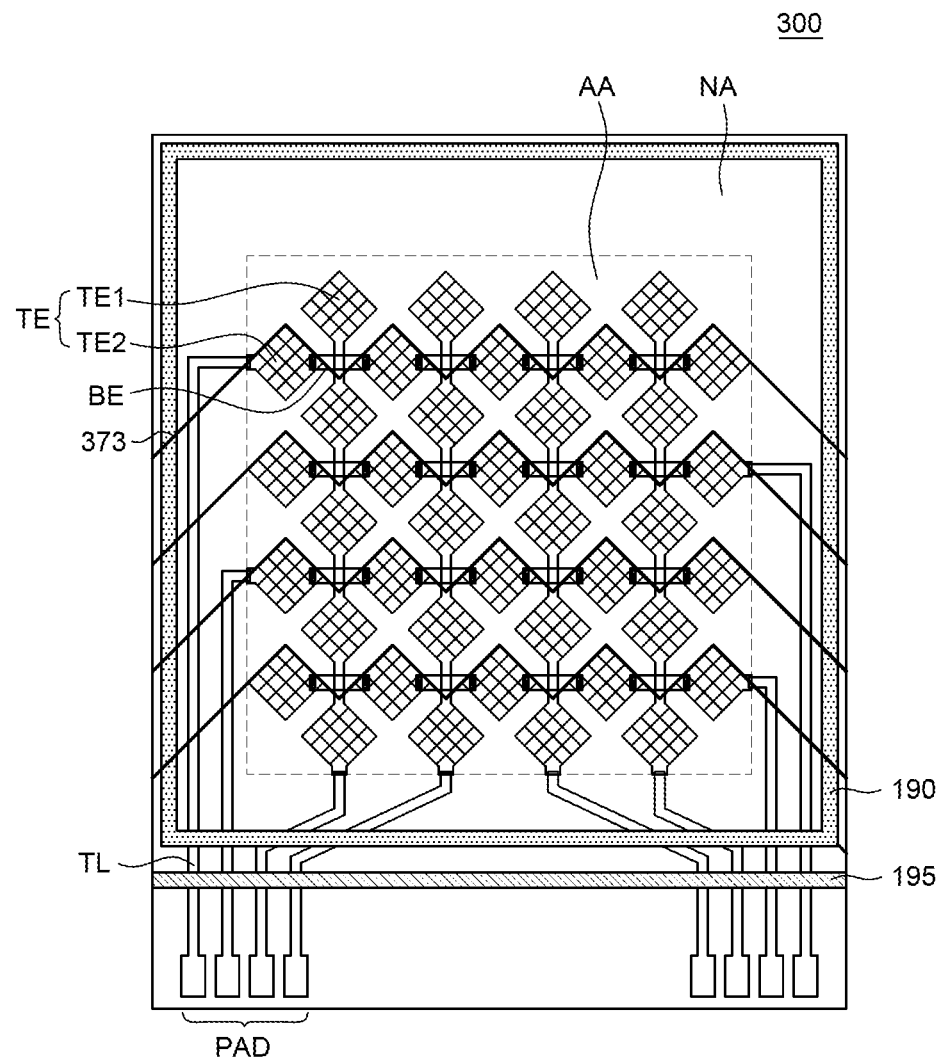
FIG. 5A, 5B and FIG. 5C are plan views illustrating yet another aspect of the display device illustrated in FIG. 1.
Figure 5B:
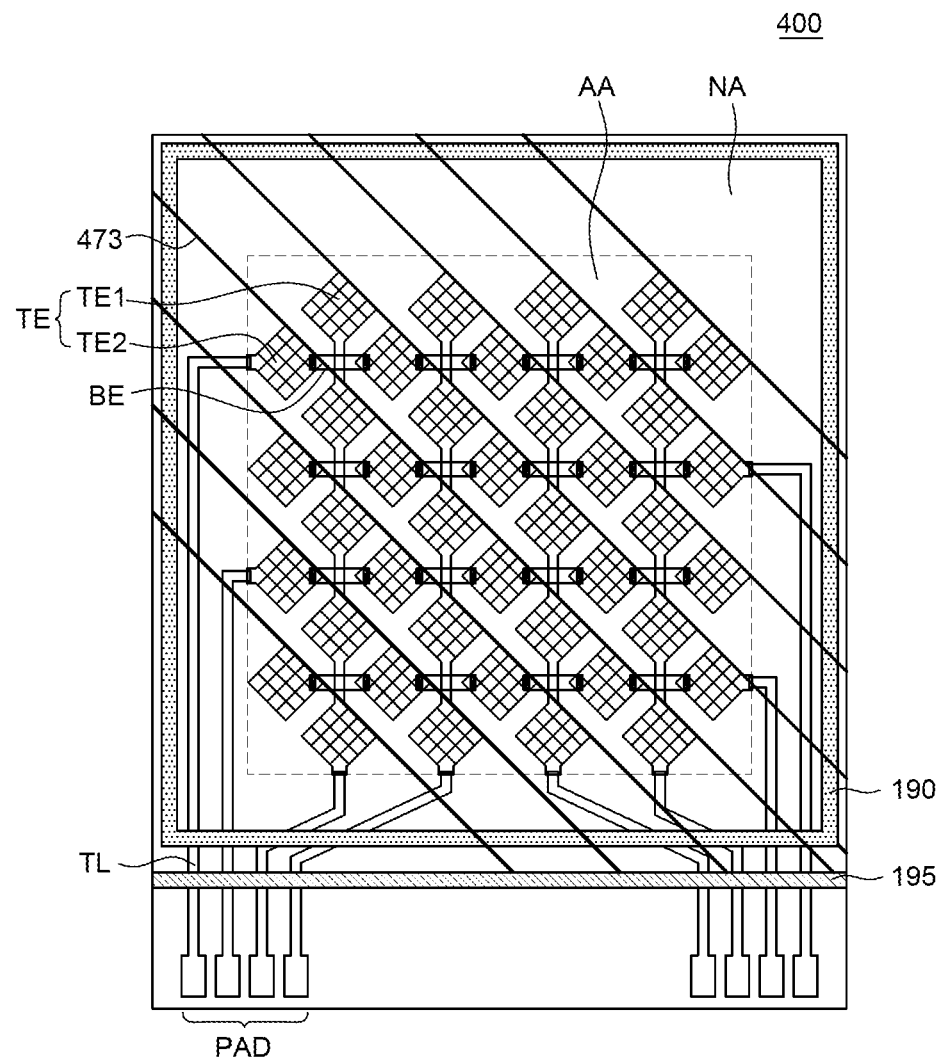
Figure 5C:
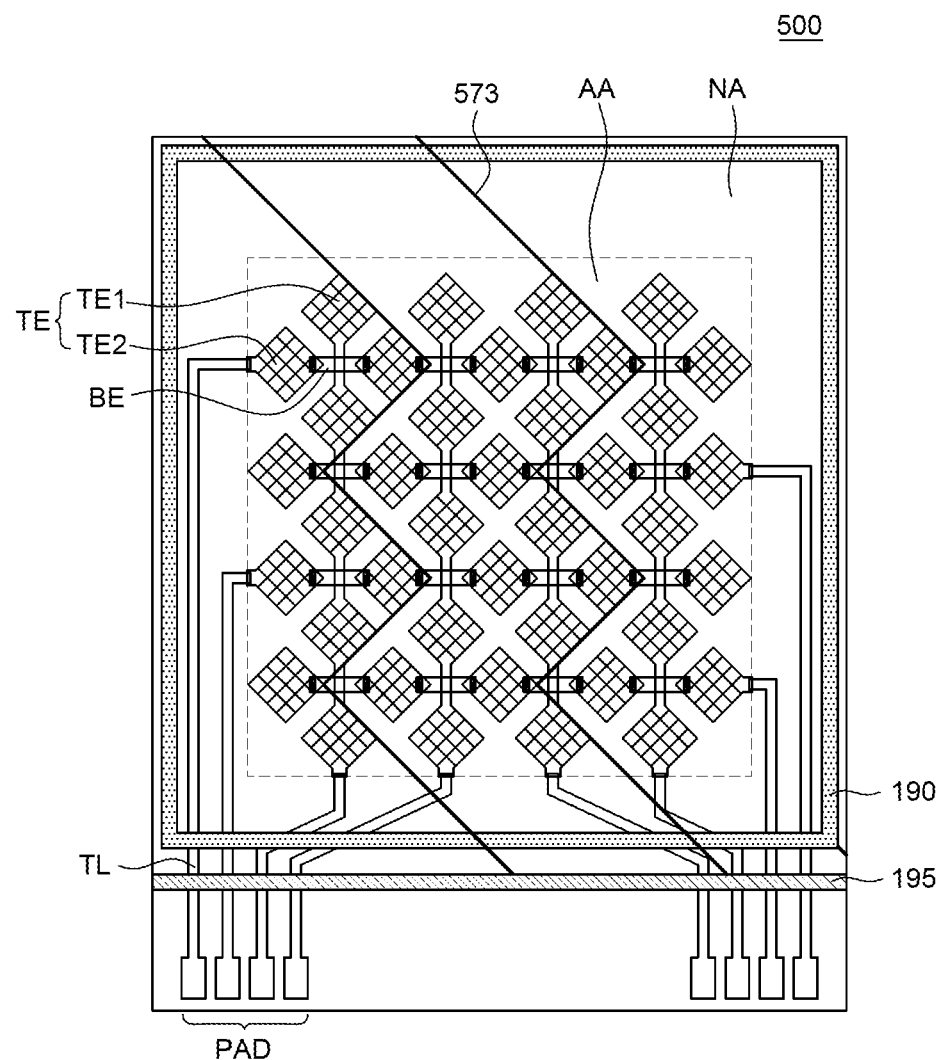

FIG. 5A through FIG. 5C are plan views illustrating yet another aspect of the display device illustrated in FIG. 1.

The display device illustrated in FIG. 5A through FIG. 5C is substantially the same as the display device illustrated in FIG. 1 through FIG. 3 except the placement of organic structures 373, 473 and 573. Therefore, a redundant description thereof will be omitted.

Referring to FIG. 5A through FIG. 5C, each of the organic structures 373, 473 and 573 may be disposed to partially cover the upper and side surfaces of the plurality of touch electrodes TE1 and TE2.

For example, as shown in FIG. 5A, the organic structure 373 may be disposed along first surfaces of the second touch electrodes TE2 and second surfaces extending in a different direction from the first surfaces. For example, as shown in FIG. 5B, the organic structure 473 may be disposed along first surfaces of the first touch electrodes TE1 and the first surfaces of the second touch electrodes TE2 respectively parallel to the first surfaces of the first touch electrodes TEL For example, as shown in FIG. 5C, the organic structure 573 may be disposed along the first surfaces of the first touch electrodes TE1 and the first surfaces of the second touch electrodes TE2 respectively parallel to the first surfaces of the first touch electrodes TEL Also, the organic structure 573 may be disposed along the second surfaces of the second touch electrodes TE2 extending in the different direction from the first surfaces of the first touch electrodes TE1, and second surfaces of the first touch electrodes TE1 respectively parallel to the second surfaces of the second touch electrodes TE2.

As described above, when each of the organic structures 373, 473 and 573 is disposed to partially cover the upper and side surfaces of the plurality of touch electrodes TE1 and TE2, the flowability of the organic layer 180 is not excessively restricted. Therefore, the organic layer 180 may be uniformly coated in the entire active area AA. Also, even if the organic layer 180 with high flowability is coated on the organic structures 373, 473 and 573, the organic layer 180 may be induced to flow along the shape of the organic structures 373, 473 and 573. Thus, it is possible to block the flow of the organic layer 180 to the touch pad PAD.

Hereinafter, a display device according to still another exemplary embodiment of the present disclosure will be described with reference to FIG. 6.

Figure 6:
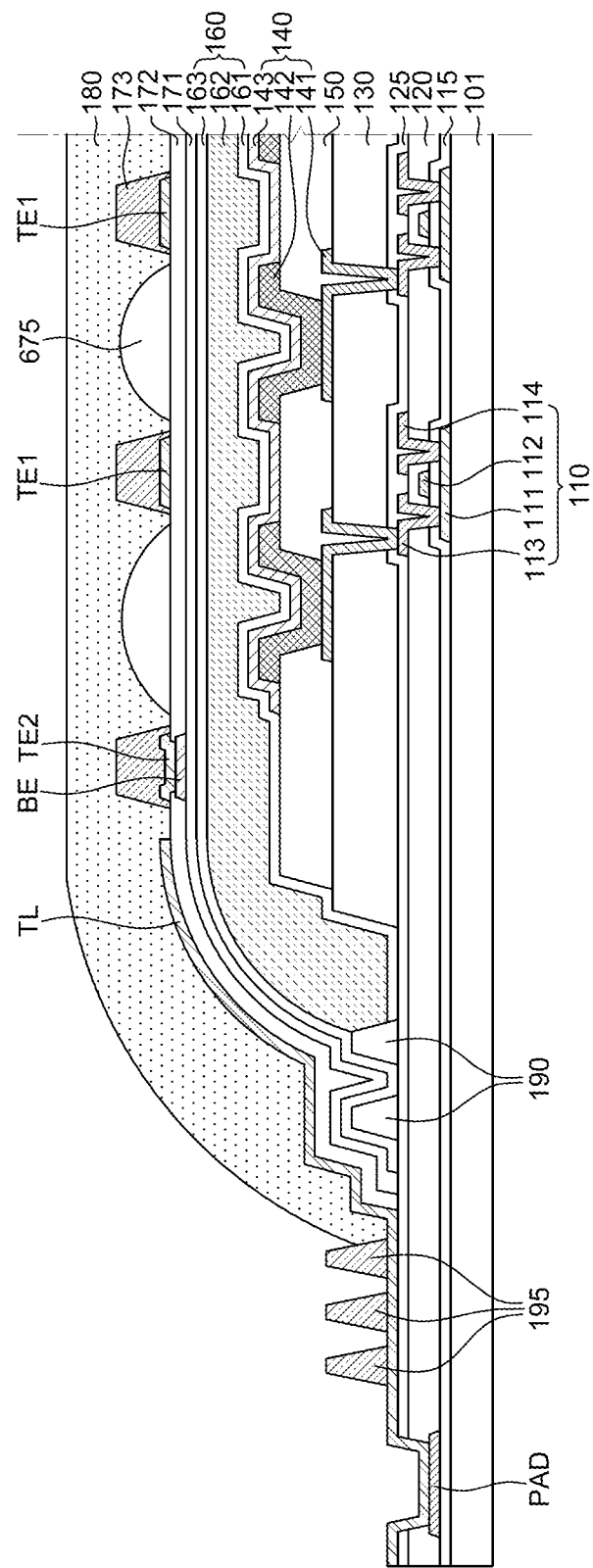
FIG. 6 is a cross-sectional view illustrating another aspect of the display device taken along the lines I-I' and II-II' of FIG. 2.

FIG. 6 is a cross-sectional view illustrating another aspect of the display device taken along the lines I-I' and II-II' of FIG. 2.

The display device illustrated in FIG. 6 is substantially the same as the display device illustrated in FIG. 1 through FIG. 3 except a lens layer 675 disposed between the organic structures 173. Therefore, a redundant description thereof will be omitted.

Referring to FIG. 6, the display device according to still another exemplary embodiment of the present disclosure further includes the lens layer 675 disposed between the organic structures 173. Herein, the lens layer 675 may be disposed to correspond to the emission area of the light emitting element 140. FIG. 6 illustrates that a single lens layer 675 is disposed in the emission area of the light emitting element 140. However, the present disclosure is not limited thereto. A plurality of lens layers 675 may be disposed in the emission area of a single light emitting element 140.

According to the present disclosure, the lens layer 675 is disposed on the encapsulation unit 160 so as to correspond to the emission area of the light emitting element 140. Thus, the light emitting element 140 may be spaced a predetermined distance apart from the lens layer 675. Therefore, it is possible to ensure a focal length of a lens to enhance concentration efficiency and emission efficiency of light emitted from the light emitting element 140. Accordingly, it is possible to enhance luminance efficiency of the display device.

Hereinafter, a display device according to still another exemplary embodiment of the present disclosure will be described with reference to FIG. 7.

Figure 7:
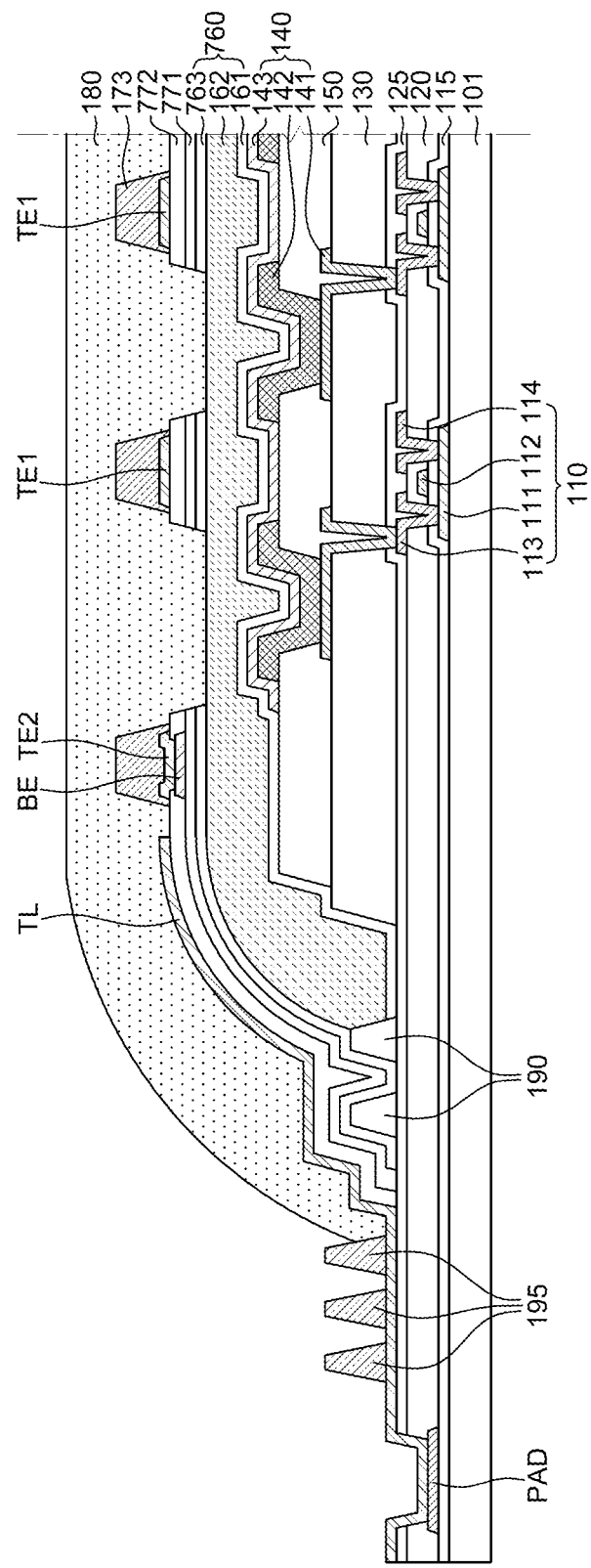
FIG. 7 is a cross-sectional view illustrating yet another aspect of the display device taken along the lines I-I' and II-II' of FIG. 2.

FIG. 7 is a cross-sectional view illustrating yet another aspect of the display device taken along the lines I-I' and II-II' of FIG. 2.

The display device illustrated in FIG. 7 is substantially the same as the display device illustrated in FIG. 1 through FIG. 3 except that a second inorganic encapsulation layer 763, a touch buffer layer 771, and a touch interlayer insulating layer 772 correspond in shape to each of the plurality of touch electrodes TE1 and TE2. Therefore, a redundant description thereof will be omitted.

Referring to FIG. 7, in the display device according to still another exemplary embodiment of the present disclosure, the second inorganic encapsulation layer 763 of an encapsulation unit 760 and the touch buffer layer 771 and the touch interlayer insulating layer 772 of the touch sensing unit correspond in shape to each of the plurality of touch electrodes TE1 and TE2. Herein, all of the second inorganic encapsulation layer 763, the touch buffer layer 771 and the touch interlayer insulating layer 772 corresponding in shape to each of the plurality of touch electrodes TE1 and TE2 are disposed in an area corresponding to the bank layer 150. However, the second inorganic encapsulation layer 763, the touch buffer layer 771 and the touch interlayer insulating layer 772 are not disposed in an area corresponding to the emission area of the light emitting element 140.

Therefore, it is possible to maximize transmittance and increase color gamut by removing an inorganic film disposed in the emission area of the light emitting element 140.

Hereinafter, a display device according to still another exemplary embodiment of the present disclosure will be described with reference to FIG. 8.

Figure 8:
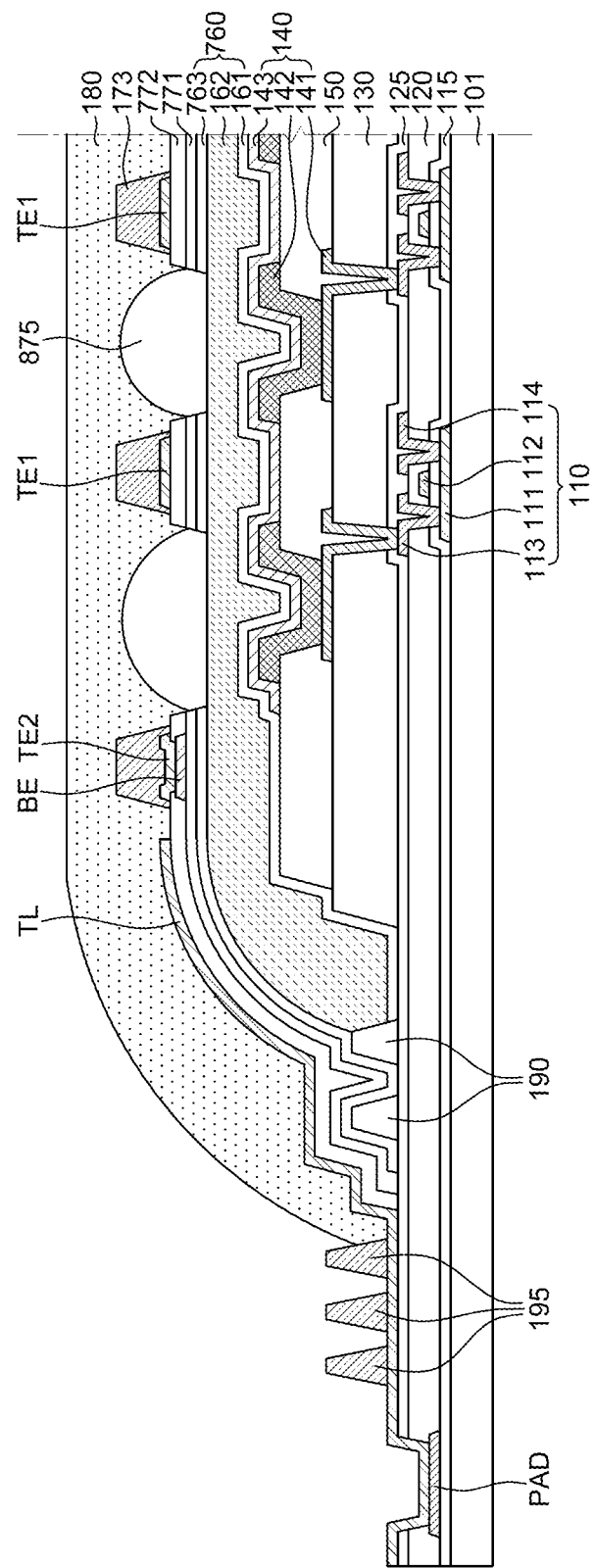
FIG. 8 is a cross-sectional view illustrating still another aspect of the display device taken along the lines I-I' and II-II' of FIG. 2.

FIG. 8 is a cross-sectional view illustrating still another aspect of the display device taken along the lines I-I' and II-II' of FIG. 2.

The display device illustrated in FIG. 8 is substantially the same as the display device illustrated in FIG. 7 except a lens layer 875 disposed between the organic structures 173 on the encapsulation unit 760. Therefore, a redundant description thereof will be omitted.

Referring to FIG. 8, in the display device according to still another exemplary embodiment of the present disclosure, the second inorganic encapsulation layer 763 of the encapsulation unit 760 and the touch buffer layer 771 and the touch interlayer insulating layer 772 of the touch sensing unit correspond in shape to each of the plurality of touch electrodes TE1 and TE2. Herein, the second inorganic encapsulation layer 763, the touch buffer layer 771 and the touch interlayer insulating layer 772 are not disposed in an area corresponding to the emission area of the light emitting element 140. Thus, the encapsulation unit, i.e., the organic encapsulation layer 162, is exposed and the lens layer 875 is disposed on the exposed organic encapsulation layer 162. FIG. 8 illustrates that a single lens layer 875 is disposed in the emission area of the light emitting element 140. However, the present disclosure is not limited thereto. A plurality of lens layers 875 may be disposed in the emission area of a single light emitting element 140.

According to the present disclosure, it is possible to maximize transmittance in the emission area by removing inorganic films from the area corresponding to the emission area of the light emitting element 140. The inorganic films may include, for example, the second inorganic encapsulation layer 763, the touch buffer layer 771 and the touch interlayer insulating layer 772.

Also, the lens layer 875 is disposed in the area corresponding to the emission area from which the inorganic films, such as the second inorganic encapsulation layer 763, the touch buffer layer 771 and the touch interlayer insulating layer 772, are removed. Thus, the light emitting element 140 may be spaced a predetermined distance apart from the lens layer 875. Therefore, it is possible to ensure a focal length of a lens to enhance concentration efficiency and emission efficiency of light emitted from the light emitting element 140. Accordingly, it is possible to enhance luminance efficiency of the display device.

The exemplary embodiments of the present disclosure can also be described as follows:

According to an aspect of the present disclosure, a display device comprising a substrate configured to include an active area and a non-active area, a plurality of light emitting elements disposed in the active area of the substrate, an encapsulation unit disposed to cover the plurality of light emitting elements, a touch sensing unit disposed on the encapsulation unit and including a plurality of touch electrodes, and an organic structure disposed on the plurality of touch electrodes to cover upper and side surfaces of the plurality of touch electrodes.

The display device may further comprise an organic layer disposed on the touch sensing unit.

the organic structure may have a greater height than the touch sensing unit.

The display device may further comprise a bank layer defining an emission area of the plurality of light emitting elements, the plurality of touch electrodes may be disposed in an area corresponding to the bank layer.

The display device may further comprise at least one dam disposed in the non-active area and configured to surround the active area, the encapsulation unit includes a first inorganic encapsulation layer, an organic encapsulation layer on the first inorganic encapsulation layer, and a second inorganic encapsulation layer on the organic encapsulation layer, and the first inorganic encapsulation layer and the second inorganic encapsulation layer may be disposed on the dam.

The display device may further comprise a plurality of touch pads disposed in the non-active area and electrically connected to the plurality of touch electrodes, and a wall disposed in the non-active area and located between the dam and the plurality of touch pads.

The display device may further comprise a plurality of touch routing lines connecting the plurality of touch electrodes and the plurality of touch pads, the wall may be disposed on the plurality of touch routing lines.

The non-active area includes a first non-active area corresponding to an inside of the wall with respect to the wall and a second non-active area located outside the wall, and the organic structure may be disposed along a shape of each of the plurality of touch electrodes in the active area and the first non-active area.

The active area includes a first active area corresponding to a central portion of the active area and a second active area surrounding the first active area, the organic structure has a layer shape throughout the first active area, and the organic structure is disposed along a shape of each of the plurality of touch electrodes in the second active area and the non-active area.

The display device may further comprise a lens layer disposed between the organic structures and disposed in an area corresponding to an emission area of the light emitting element.

The touch sensing unit includes a touch buffer layer disposed on the encapsulation unit, a bridge electrode disposed on the touch buffer layer, a touch interlayer insulating layer disposed on the touch buffer layer and the bridge electrode, and the plurality of touch electrodes disposed on the touch interlayer insulating layer, and the second inorganic encapsulation layer, the touch buffer layer and the touch interlayer insulating layer may have shape correspond in shape of each of the plurality of touch electrodes.

The display device may further comprise a lens layer disposed between the organic structures on the encapsulation unit and disposed in an area corresponding to an emission area of the light emitting element.

The plurality of touch electrodes includes a first touch electrode and a second touch electrode overlapping each other, and the organic structure may be disposed along a first surface of the second touch electrode and a second surface extending in a different direction from the first surface.

The plurality of touch electrodes includes a first touch electrode and a second touch electrode overlapping each other, and the organic structure may be disposed along a first surface of the first touch electrode and a first surface of the second touch electrode parallel to the first surface of the first touch electrode.

The plurality of touch electrodes includes a first touch electrode and a second touch electrode overlapping each other, and the organic structure may be disposed along a first surface of the first touch electrode, a first surface of the second touch electrode parallel to the first surface of the first touch electrode, a second surface of the second touch electrode extending in a different direction from the first surface of the first touch electrode, and a second surface of the first touch electrode parallel to the second surface of the second touch electrode.

According to another aspect of the present disclosure, a display device comprising a substrate configured to include an active area with a plurality of pixels and a non-active area surrounding the active area, a plurality of light emitting elements disposed to correspond to the plurality of pixels, an encapsulation unit disposed on the plurality of light emitting elements, a touch sensing unit disposed on the encapsulation unit and including a plurality of touch electrodes, an organic structure disposed to cover the plurality of touch electrodes, and an organic layer disposed to cover the touch sensing unit and the organic structure.

The organic structure may be disposed on the plurality of touch electrodes to cover upper and side surfaces of the plurality of touch electrodes, respectively.

The display device may further comprise at least one dam disposed in the non-active area and configured to surround the active area, the encapsulation unit includes a first inorganic encapsulation layer, an organic encapsulation layer on the first inorganic encapsulation layer, and a second inorganic encapsulation layer on the organic encapsulation layer, and the first inorganic encapsulation layer and the second inorganic encapsulation layer may be disposed on the dam.

The display device may further comprise a plurality of touch pads disposed in the non-active area and electrically connected to the plurality of touch electrodes, and a wall disposed in the non-active area and located between the dam and the plurality of touch pads.

The display device may further comprise a plurality of touch routing lines connecting the plurality of touch electrodes and the plurality of touch pads, the wall may be disposed on the plurality of touch routing lines.

The display device may further comprise a lens layer disposed between the organic structures and disposed in an area corresponding to an emission area of the light emitting element.

The wall and the organic structure may be made of the same material.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate having an active area and a non-active area;
   a plurality of light emitting elements disposed in the active area of the substrate;
   an encapsulation unit on the plurality of light emitting elements;
   a touch sensing circuit on the encapsulation unit, the touch sensing circuit including a plurality of touch electrodes having an upper surface and a side surface;
   an organic structure on the plurality of touch electrodes to cover the upper and side surfaces of the plurality of touch electrodes; and
   an organic layer directly disposed on the organic structure and the encapsulation unit,
   wherein the touch sensing circuit includes a touch buffer layer on the encapsulation unit, a bridge electrode on the touch buffer layer, a touch interlayer insulating layer on the touch buffer layer and the bridge electrode, and the plurality of touch electrodes on the touch interlayer insulating layer,
   wherein the touch buffer layer and the touch interlayer insulating layer has shape correspond in shape of each of the plurality of touch electrodes,
   wherein the active area includes a first active area corresponding to a central portion of the active area and a second active area surrounding the first active area,
   wherein the organic structure has a layer shape throughout the first active area, and
   wherein the organic structure is disposed along a shape of each of the plurality of touch electrodes in the second active area and the non-active area.

2. The display device according to claim 1, wherein the organic structure has a greater height than the touch sensing circuit.

3. The display device according to claim 1, further comprising:
   a bank layer defining an emission area of the plurality of light emitting elements,
   wherein the plurality of touch electrodes is disposed in an area corresponding to the bank layer.

4. The display device according to claim 1, further comprising:
   at least one dam disposed in the non-active area, the at least one dam surrounding the active area,
   wherein the encapsulation unit includes a first inorganic encapsulation layer, an organic encapsulation layer on the first inorganic encapsulation layer, and a second inorganic encapsulation layer on the organic encapsulation layer, and
   wherein the first inorganic encapsulation layer and the second inorganic encapsulation layer are on the at least one dam.

5. The display device according to claim 4, further comprising:
   a plurality of touch pads disposed in the non-active area and electrically connected to the plurality of touch electrodes; and
   a wall disposed in the non-active area and located between the at least one dam and the plurality of touch pads.

6. The display device according to claim 5, further comprising:
   a plurality of touch routing lines coupling the plurality of touch electrodes and the plurality of touch pads,
   wherein the wall is disposed on the plurality of touch routing lines.

7. The display device according to claim 6, wherein the non-active area includes a first non-active area corresponding to an inside of the wall with respect to the wall and a second non-active area located outside the wall, and
   wherein the organic structure is disposed along a shape of each of the plurality of touch electrodes in the second active area and the first non-active area.

8. The display device according to claim 5, wherein the wall and the organic structure are made of the same material.

9. The display device according to claim 4,
   wherein the second inorganic encapsulation layer has shape correspond in shape of each of the plurality of touch electrodes.

10. The display device according to claim 1, wherein the plurality of touch electrodes includes a first touch electrode and a second touch electrode overlapping each other, and
    wherein the organic structure is disposed along a first surface of the second touch electrode and a second surface extending in a different direction from the first surface.

11. The display device according to claim 1, wherein the plurality of touch electrodes includes a first touch electrode and a second touch electrode overlapping each other, and
    wherein the organic structure is disposed along a first surface of the first touch electrode and a first surface of the second touch electrode parallel to the first surface of the first touch electrode.

12. The display device according to claim 1, wherein the plurality of touch electrodes includes a first touch electrode and a second touch electrode overlapping each other, and
    wherein the organic structure is disposed along a first surface of the first touch electrode, a first surface of the second touch electrode parallel to the first surface of the first touch electrode, a second surface of the second touch electrode extending in a different direction from the first surface of the first touch electrode, and a second surface of the first touch electrode parallel to the second surface of the second touch electrode.

* * * * *